(12) United States Patent
Weis

(10) Patent No.: US 6,576,944 B2
(45) Date of Patent: Jun. 10, 2003

(54) SELF-ALIGNED NITRIDE PATTERN FOR IMPROVED PROCESS WINDOW

(75) Inventor: Rolf Weis, Wappinger Falls, NY (US)

(73) Assignee: Infineon Technologies AG, Munich (DE)

( * ) Notice: Subject to any disclaimer, the term of this patent is extended or adjusted under 35 U.S.C. 154(b) by 124 days.

(21) Appl. No.: 09/736,940

(22) Filed: Dec. 14, 2000

(65) Prior Publication Data

US 2002/0076884 A1 Jun. 20, 2002

(51) Int. Cl.[7] ................ H01L 29/94; H01L 21/336; H01L 29/76; H01L 31/062
(52) U.S. Cl. ................ 257/301; 257/302; 257/396; 257/301; 438/414; 438/221; 438/270
(58) Field of Search ................ 438/414, 221, 438/229, 233, 302, 270, 272; 257/330, 333, 334, 301, 302, 396, 397, 773

(56) References Cited

U.S. PATENT DOCUMENTS

| | | | | |
|---|---|---|---|---|
| 5,904,531 A | * | 5/1999 | Liaw | 438/296 |
| 5,937,296 A | | 8/1999 | Arnold | 438/270 |
| 6,143,595 A | * | 11/2000 | Hsu | 438/221 |
| 6,153,934 A | * | 11/2000 | Allen et al. | 257/773 |
| 6,288,442 B1 | * | 9/2001 | Mandelman et al. | 257/301 |
| 6,355,520 B1 | * | 3/2002 | Park et al. | 438/253 |

* cited by examiner

Primary Examiner—Caridad Everhart
(74) Attorney, Agent, or Firm—Stanton Braden

(57) ABSTRACT

A device and method for fabricating a gate structure are disclosed. A first conductive material is deposited in a trench formed in a substrate and the first conductive material is recessed to a level below a top surface of the substrate in the trench. A dielectric layer is conformally deposited in contact with the first conductive material in the trench and in contact with sidewalls of the trench. A hole is formed in the dielectric layer to expose the first conductive layer, and the hole is filled with a conductive material. A gate stack is formed over the trench such that an electrical connection is made to the first conductive layer in the trench by employing the conductive material through the dielectric layer.

19 Claims, 14 Drawing Sheets

US 6,576,944 B2

SELF-ALIGNED NITRIDE PATTERN FOR IMPROVED PROCESS WINDOW

BACKGROUND

1. Technical Field

This disclosure relates to semiconductor fabrication, and more particularly, to a method for forming a connection to a gate stack of a vertical transistor while providing protection for a gate conductor during bitline contact formation.

2. Description of the Related Art

To increase memory cell density on a surface of a semiconductor chip, vertically disposed transistors have been introduced. Processing to form these vertical devices (vertical transistors) typically includes forming a portion of a gate conductor in a trench and forming a portion of the gate conductor above the trench. The portion of the gate conductor in the trench permits conduction in a channel formed in a substrate adjacent to the gate conductor. Current flow in the channel occurs when a voltage is applied to the gate conductor.

Since the portion of the gate conductor formed outside the trench, also called a gate stack must be patterned, an etching process is employed to etch the gate stack to form a word line above the trench. Currently all processes with vertical array transistors suffer form a small gate stack etch process window.

To ensure the removal of all unwanted conductive material from a surface of a semiconductor device overetching of the gate stack materials is often employed. The overetching of gate stack layer removes all unwanted conductive materials that could cause that wordline-bitline shorts. However, since the formation of the gate stack is very sensitive to misalignment, any shift or misalignment of the gate stack relative to the trench over which the gate stack is formed exposes the gate conductor in the trench. Another problem arises if the trench is oversized as compared to the width of the gate conductor. This situation is common since process bias typically increases the trench size. This situation makes shorts between wordlines and bitlines more likely since bitline contacts, which are formed next to the gate stack, have a higher probability of making contact with the gate conductor in the trench.

The time necessary to etch the gate stack in a support area or any misalignment of the gate stack with respect to the trench over which the gate stack is formed, results in a recessed profile of the gate conductor of the vertical array device. Misalignment between the gate stack and the portion of the gate conductor formed inside the trench may cause etching of or damage to the gate conductor in the trench unless process parameters are tightly controlled.

Since it is undesirable to etch the portion of the gate conductor inside the trench when patterning the gate stack outside the trench, the process window is maintained very tightly. Tight process windows are difficult to maintain, however, and contribute to manufacturing difficulties in semiconductor fabrication.

Therefore, a need exists for a fabrication method for forming a gate conductor, which enables greater leeway in an etching process window for a gate stack patterning etch and provides increased etching time to ensure proper removal of conductive materials used in the formation of the gate stack.

SUMMARY OF THE INVENTION

A method for fabricating a gate structure deposits a first conductive material in a trench formed in a substrate and recesses the first conductive material to a level below a top surface of the substrate in the trench. A dielectric layer is conformally deposited in contact with the first conductive material in the trench and in contact with sidewalls of the trench. A hole is formed in the dielectric layer to expose the first conductive layer, and the hole is filled with a conductive material. A gate stack is formed over the trench such that an electrical connection is made to the first conductive layer in the trench by employing the conductive material through the dielectric layer.

In other methods, the step of recessing the first conductive material may include the step of providing an etch mask layer to etch a top surface of the substrate to form an upper portion of the trench which is wider than a lower portion of the trench. The step of conformally depositing a dielectric layer may include forming the dielectric layer in the upper portion of the trench. The step of forming a gate stack preferably includes depositing a layer polysilicon in contact with the conductive material and depositing an additional conductive material over the polysilicon layer. The first conductive layer and the conductive material inside the trench preferably form a gate conductor for a vertical transistor. The dielectric layer preferably includes nitride. The conductive layer and the conductive material preferably include polysilicon.

Another method for fabricating a gate structure for vertical transistors of the present invention includes providing a semiconductor substrate having a trench formed therein having a storage node formed in the trench, forming an isolation layer in the trench on top of the storage node, depositing a first conductive material in the trench over the isolation layer, recessing the first conductive material to a level below a top surface of the substrate in the trench, conformally depositing a dielectric layer in contact with the first conductive material in the trench and in contact with sidewalls of the trench, etching the dielectric layer to form a dielectric cap in the trench, the cap forming a hole to expose the first conductive layer, filling the hole with a conductive material, depositing a second conductive layer over the trench and patterning the second conductive layer over the trench to form a gate stack in electrical contact with the first conductive layer.

In other methods, the step of recessing the first conductive material may include the step of providing an etch mask layer to etch a top surface of the substrate to form an upper portion of the trench which is wider than a lower portion of the trench. The step of conformally depositing a dielectric layer may include forming the dielectric layer in the upper portion of the trench. The step of forming a gate stack preferably includes depositing a layer polysilicon in contact with the conductive material and depositing an additional conductive material over the polysilicon layer. The step of forming a gate oxide on a sidewall of the trench is preferably included. The method may include the step of performing an angled implantation of dopants to form a junction along a sidewall of the trench. The dielectric layer preferably includes nitride. The first and second conductive layers and the conductive material preferably include polysilicon.

A semiconductor device of the present invention includes a gate conductor formed in a trench, a gate stack formed over the gate conductor and a dielectric cap layer formed between the gate conductor and the gate stack. The cap layer permits an electrical connection between the gate conductor and the gate stack and prevents damage of the gate conductor during the formation of the gate stack.

In other embodiments, the cap layer preferably includes nitride. The trench is formed in a substrate, the trench including an upper portion and a lower portion, the upper portion of the trench being wider than the lower portion of the trench. The wider portion forms a recess into which the cap layer may be formed. The cap layer is preferably formed in the upper portion of the trench below a top surface of the substrate. The gate stack is preferably a word line and the gate conductor is preferably a gate for a vertical transistor.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides a method and apparatus for increasing the process window for a gate stack patterning etch. The present invention makes alignment between the gate stack and the trench less critical. In accordance with the present invention, a top portion of a trench, such as a deep trench (DT), is covered with a self-aligned cap. The cap forms an opening in communication with a gate conductor formed in the trench. A conductive plug is formed in the opening such that when a gate stack layer is formed, the gate stack connects to the gate conductor in the trench. The cap of the present invention permits more leeway in aligning the gate stack to the trench. Greater misalignment is tolerated without risk of damage to the gate conductor formed in the trench, and a significantly larger process window can be achieved for patterning gate stack layers for the formation of a transistor gate. Easier contact processing is also achieved in accordance with the present invention. For example, the active area can have self-aligned contacts formed through a layer of cap material of a gate stack. If the gate stack is chosen to be encapsulated in nitride, for example, an oxide etch selective to the nitride of the gate stack can be used to form contact holes. The gate conductor is advantageously protected by the self-aligned cap and provides a dielectric barrier between the contact and the gate conductor.

The present invention will illustratively be described in terms of a gate conductor and gate stack for use with a vertical transistor device; however, the present invention is broader and is applicable to any semiconductor fabrication process where it is desirable to provide a cap layer to increase process window.

Figure 1:
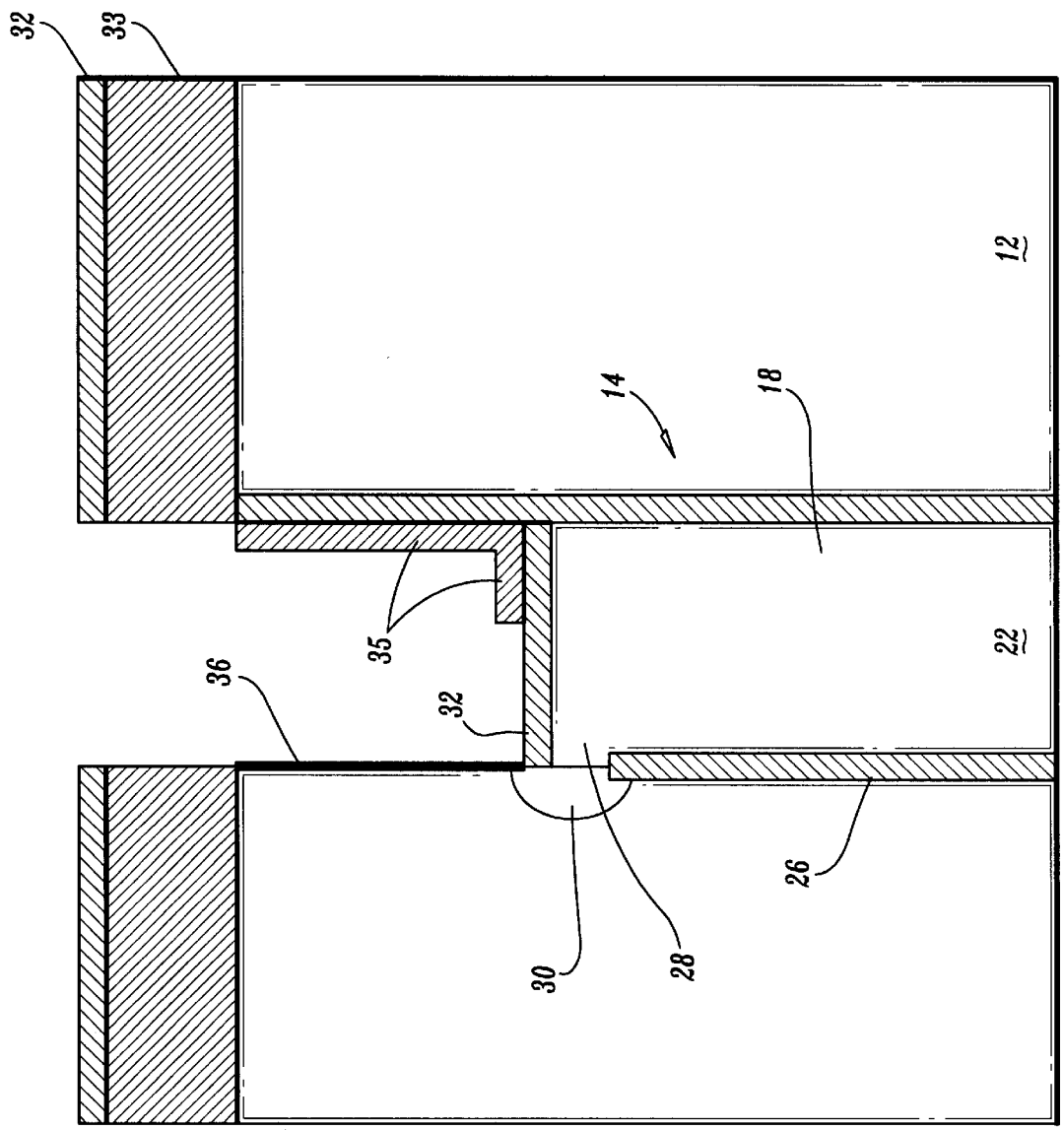
FIG. 1 is a cross-sectional view of a semiconductor device showing patterning of a collar and gate dielectric (oxide) formation in accordance with the present invention.

Referring now in specific detail to the drawings in which like reference numerals identify similar or identical elements throughout the several views, and initially to FIG. 1, a cross-sectional view of a semiconductor device 10 is shown in accordance with one illustrative embodiment of the present invention. Device 10 of the illustrative embodiment includes a semiconductor memory device, such as a dynamic random access memory (DRAM) device. Other devices and structures may also employ the present invention. Device 10 includes a semiconductor substrate 12, such as a monocrystalline silicon substrate. Substrate 12 has deep trenches 14 etched therein which are preferably employed for deep trench capacitors. Trenches 14 are filled with a conductive material 18, such as for example, polysilicon, to form storage nodes for storing charge for representing data. Substrate 12 includes p-wells, n-wells and other regions formed therein, as are known in the art. A buried plate (not shown) is formed surrounding a lower portion of trench 14, as is known in the art. Buried plate, along with storage node 22, form plates for a deep trench capacitor.

A liner (not shown), preferably nitride, lines a lower portion of trench 14 and forms the capacitor dielectric for the trench capacitor. A collar 26, preferably formed from an oxide, separates storage node 22 from substrate 12 to prevent parasitic leakage from storage node 22. A buried strap 28 includes an outdiffusion region 30 which will be employed to connect a transistor channel of a vertical transistor formed adjacent to trench 14 (see FIG. 14). A trench top dielectric layer 32 (e.g., a trench top oxide (TTO)) is formed to isolate storage node 22 from a gate conductor, which will be formed as described below.

Layer 32 is also formed on a top surface of substrate 12. A surface 34 of substrate 12 is exposed by removing collar 26. A liner 35 may include nitride and may be employed to protect portions of collar 26, which are not to be removed. Surface 34 is oxidized to form a gate oxide 36 to provide a gate dielectric between a gate conductor and substrate 12. Liner 35 may be removed or left in trench 14. A pad dielectric layer 33 is formed on a top surface of substrate 12. Pad dielectric layer 33 may include a nitride layer (pad nitride) and an oxide layer (pad oxide) as is known in the art.

Figure 2:
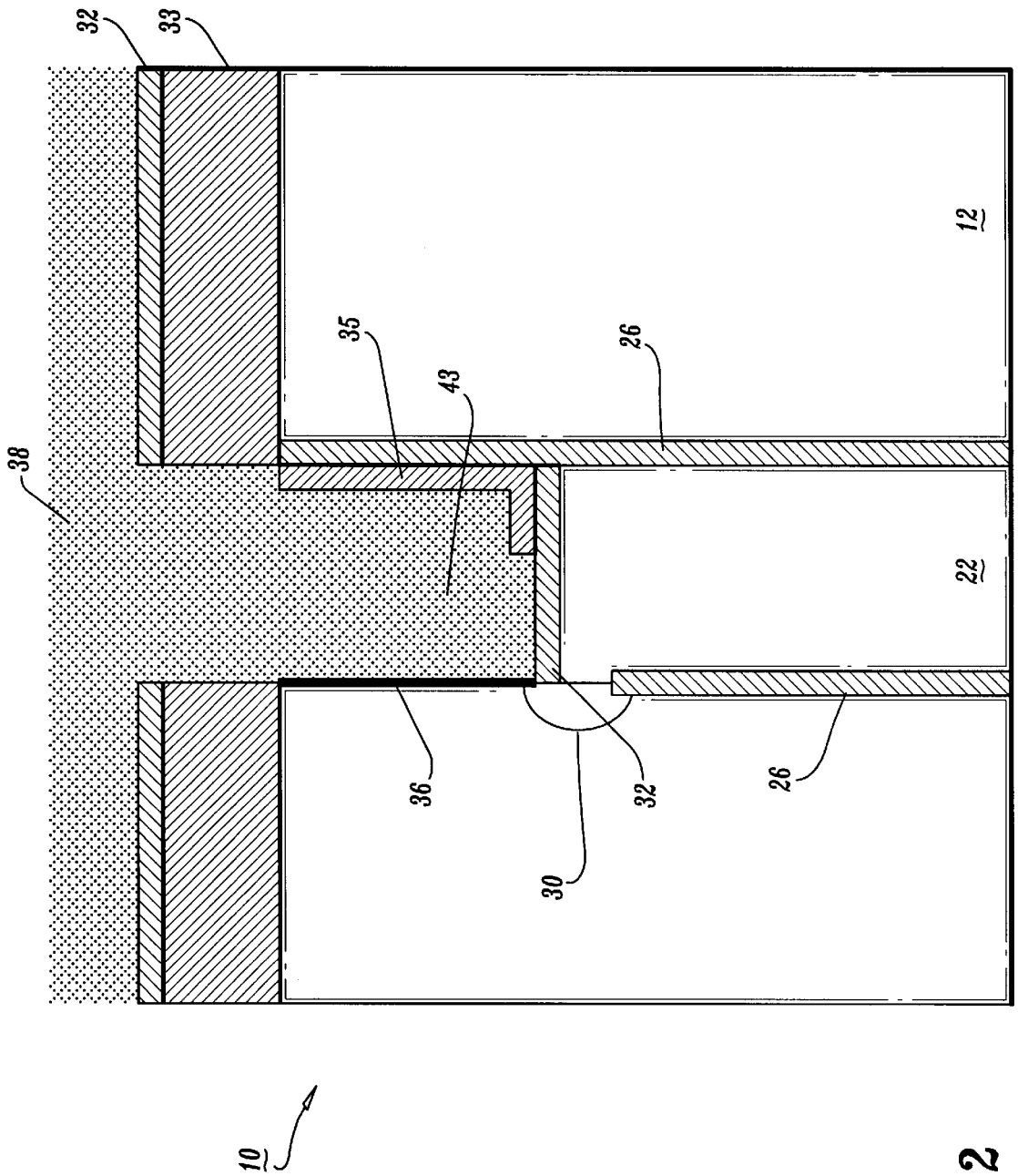
FIG. 2 is a cross-sectional view of the semiconductor device of FIG. 1 showing a first conductive material deposited in a trench in accordance with the present invention.

Referring to FIG. 2, a conductive layer 38 is deposited on layer 32 and gate oxide 36 (and layer 35, if not removed). Conductive layer 38, preferably includes doped polysilicon (e.g., N+ doped polysilicon). A portion 43 of conductive layer 38 in trench 14 will form a gate conductor for a vertical transistor. Conductive layer 38 is preferably deposited to fill the upper portion of trench 14.

Figure 3:
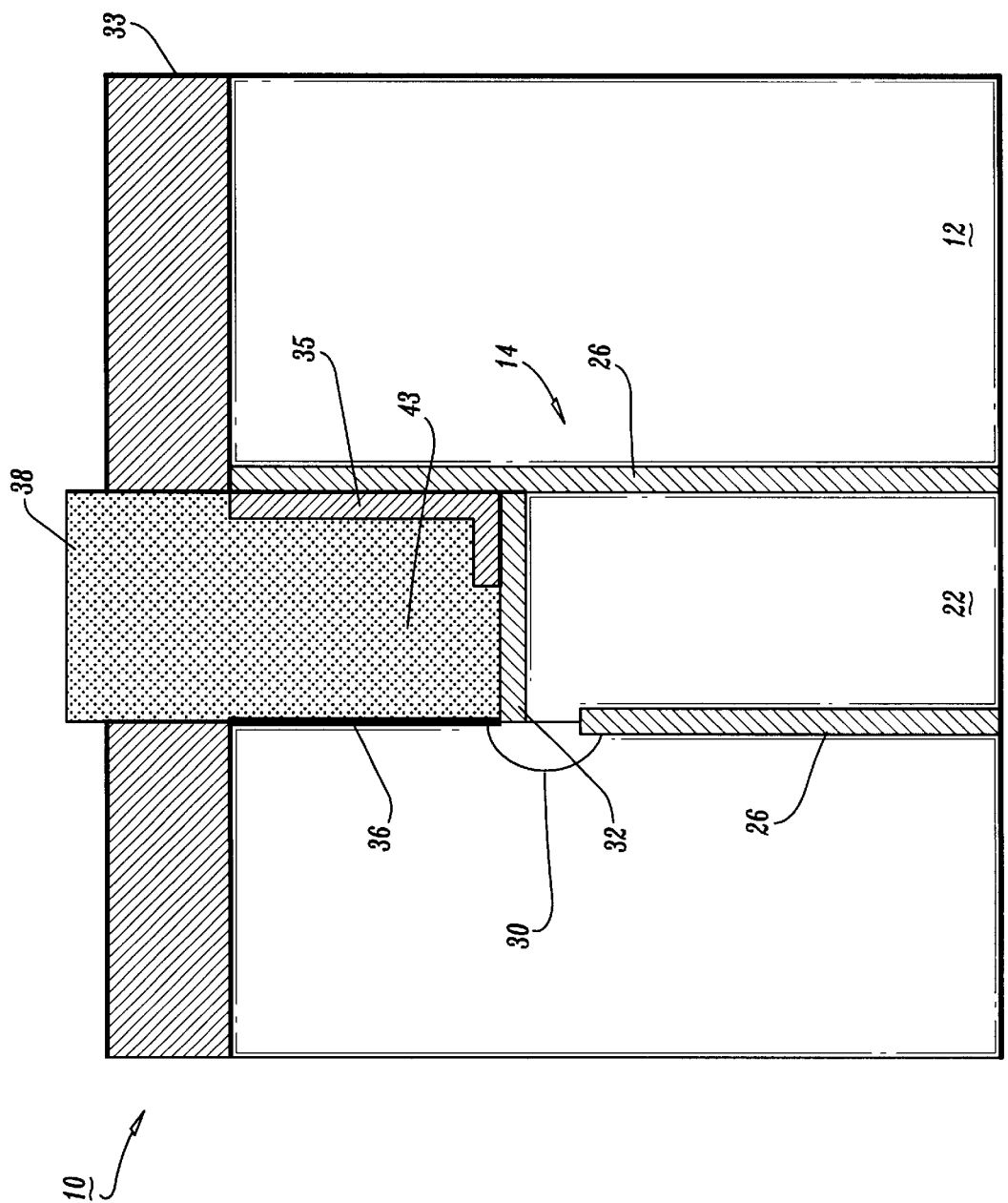
FIG. 3 is a cross-sectional view of the semiconductor device of FIG. 2 showing the first conductive layer planarized and a trench top dielectric layer removed in accordance with the present invention.
Figure 4:
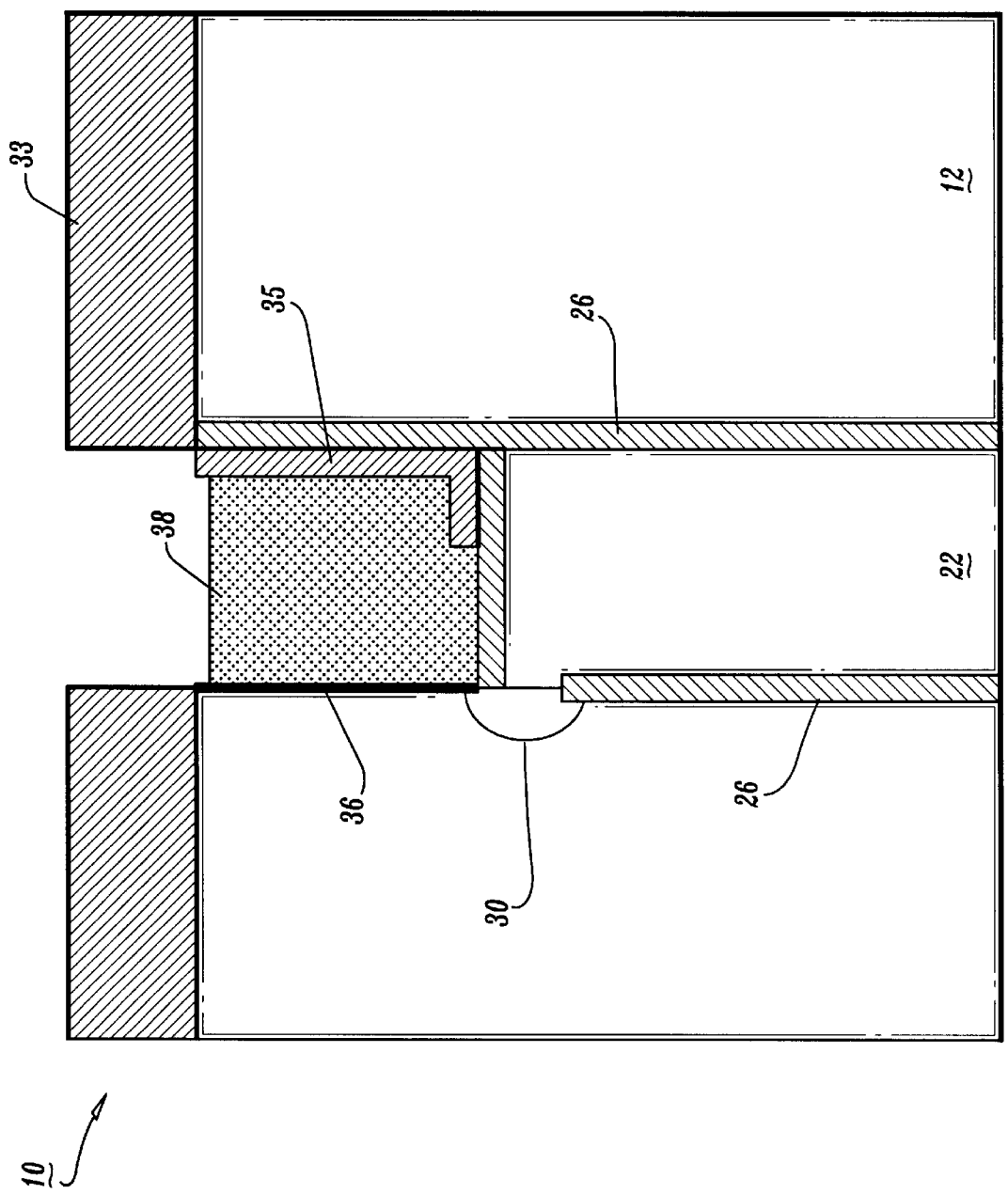
FIG. 4 is a cross-sectional view of the semiconductor device of FIG. 3 showing the first conductive layer recessed into a trench in accordance with the present invention.

Referring to FIG. 3, layer 38 is planarized by, for example, by a chemical mechanical polish (CMP) process down to layer 32. In one example, layer 32 includes a high density plasma (HDP) oxide and a HDP wet removal process may be employed to remove layer 32 from layer 33. As shown in FIG. 4, layer 38 is then recessed down to below the top surface of substrate 12 by an etching process, which selectively removes layer 38 with respect to layer 33.

Figure 5:
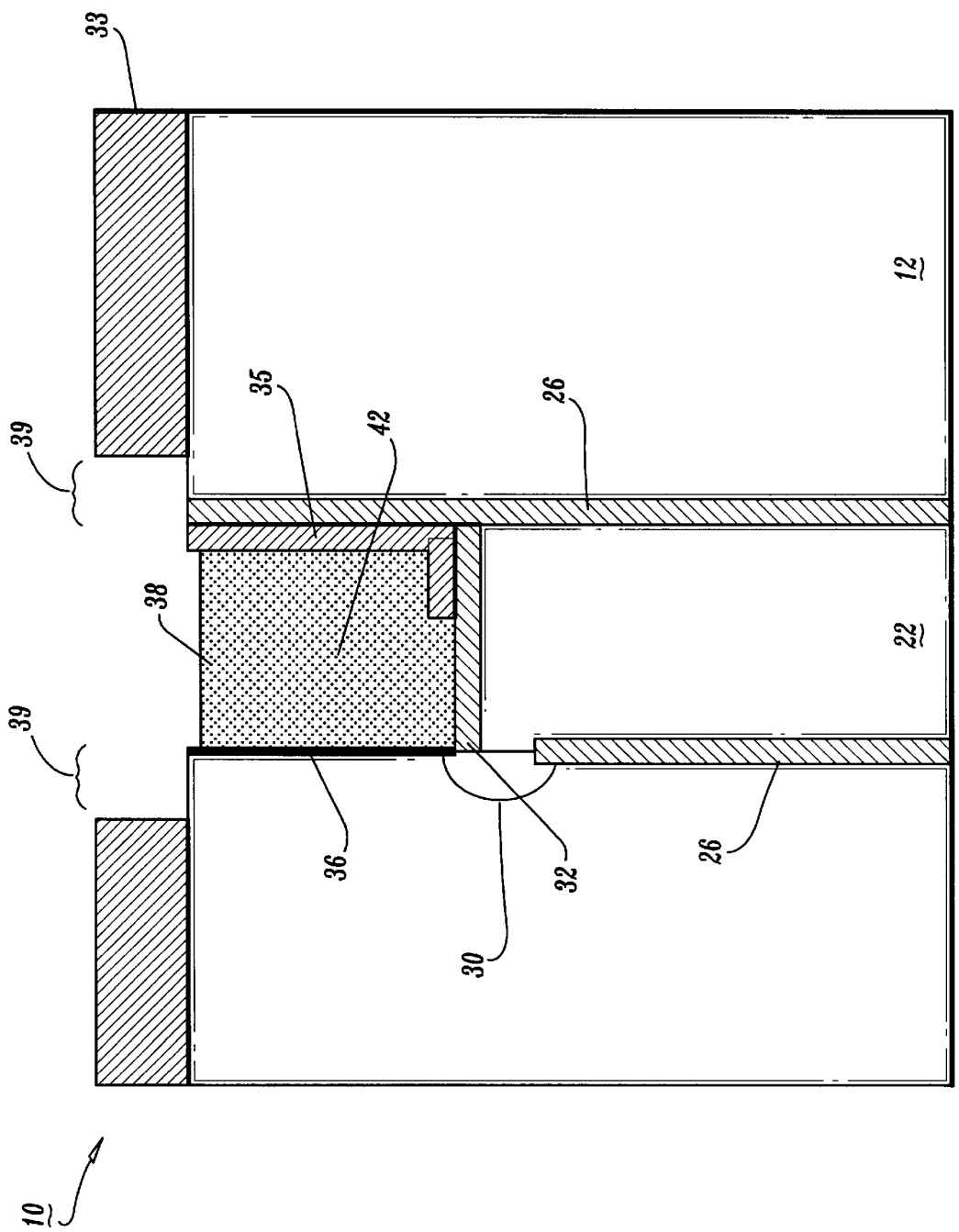
FIG. 5 is a cross-sectional view of the semiconductor device of FIG. 4 showing an optional step of pulling back a pad dielectric layer to expose a portion of the top surface of a substrate in accordance with the present invention.

Referring to FIG. 5, layer 33 is opened up (or pulled back) over substrate 12 to expose regions 39. For example, layer 33 is etched by a hot phosphor pull back process to recess or pull back ends of layer 33. In one example, ¼ F of layer 33 is removed on each side (region 39) where F is the groundrule or minimum feature size of the technology being employed. The remaining portion of layer 38 forms a gate conductor 42. This pull back process is optional depending on the size of the substrate recess needed. This may depend on the size of the trench compared to the gate stack width and/or the overlay requirements between layers (e.g., the gate conductor layer (GC) to deep trench (DT) layer).

Figure 6:
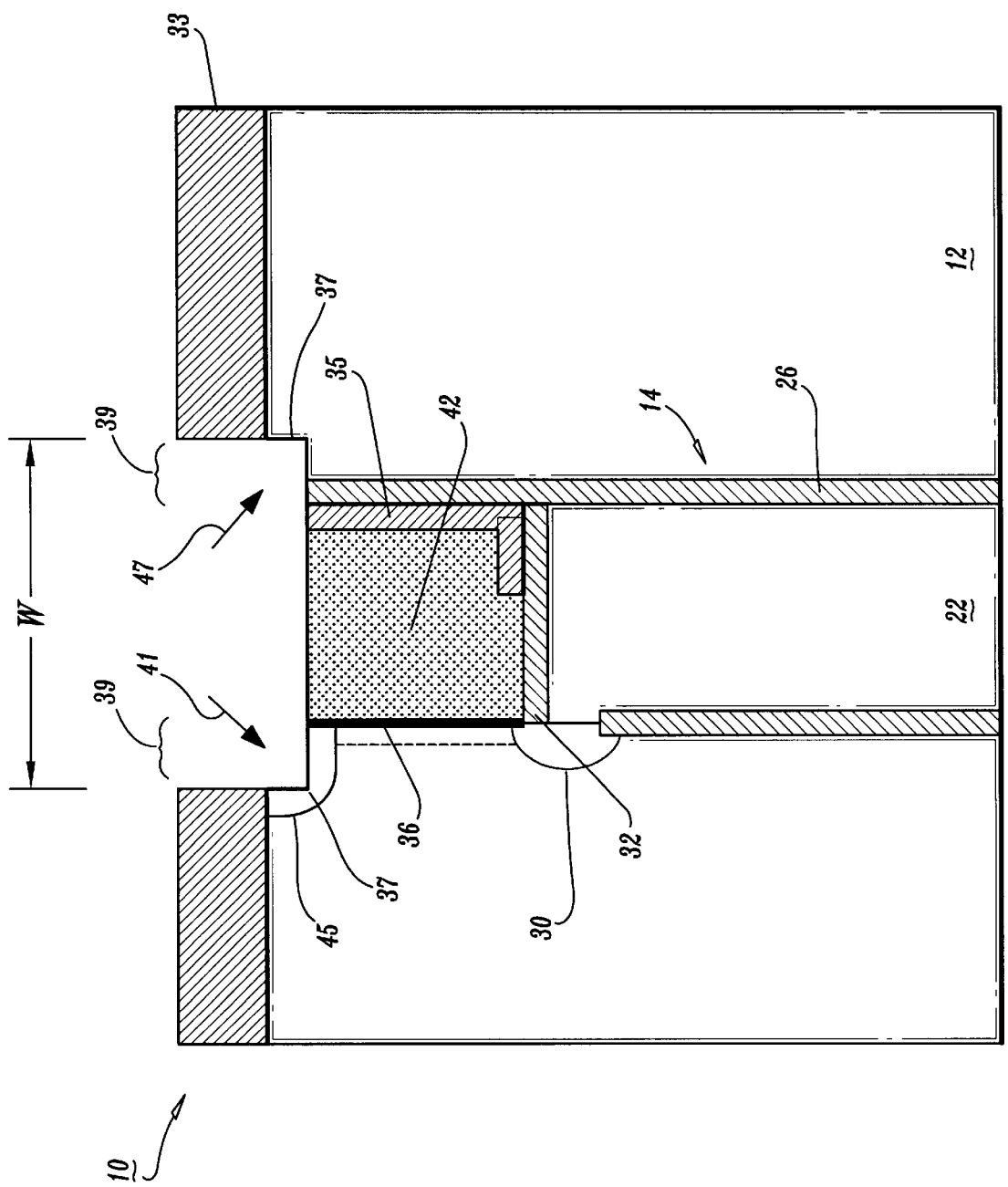
FIG. 6 is a cross-sectional view of the semiconductor device of FIG. 5 after the top surface of the substrate is etched, a gate oxide formed on the substrate and dopants implanted in accordance with the present invention.

Referring to FIG. 6, layer 33 is employed as an etch mask to recess substrate 12 to a depth of between about ½ to a whole thickness of layer 33 in regions 39. In one example, the dimension W is about ½ F plus the width of trench 14. After recessing substrate 12, oxidation is performed to form a gate oxide 37 in etched portions of substrate 12. Dopants 41 and 43 may be introduced into substrate 12, by for example a gas phase doping process or by angled implantation into substrate 12. Dopants 41 are preferably employed to ensure proper channel formation of a junction region 45. Dopants 47 are preferably employed to dope behind collar 26 to prevent the formation of a parasitic field effect transistor which can form along trench 14 and cause current leakage from storage node 22.

Figure 7:
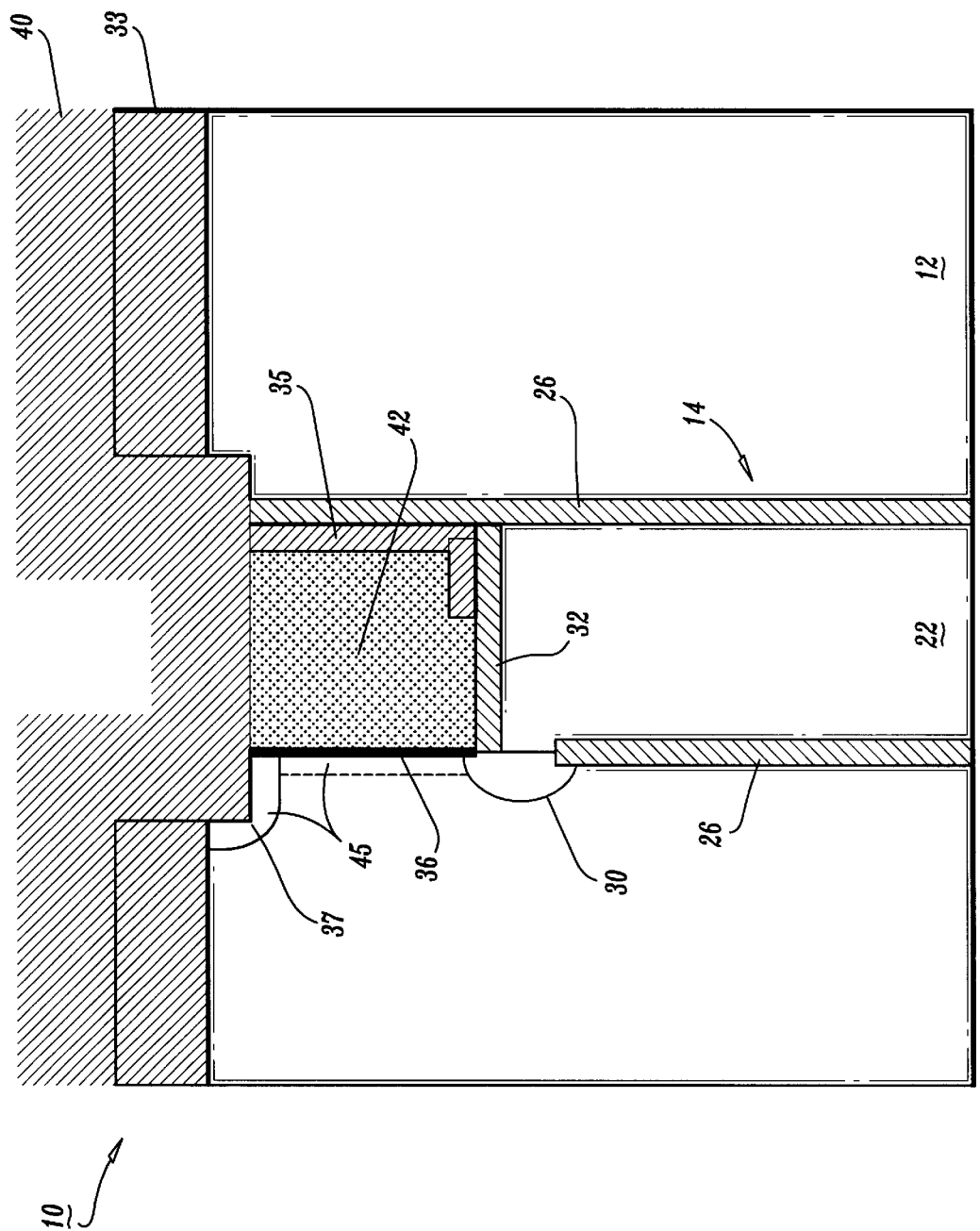
FIG. 7 is a cross-sectional view of the semiconductor device of FIG. 6 showing a conformal dielectric layer formed in accordance with the present invention.

Referring to FIG. 7, a dielectric layer 40 is deposited on the surface of layer 33 and in the recess formed in the upper portion of trench 14 in contact with gate conductor 42. Dielectric layer 40, preferably includes a nitride material, e.g., silicon nitride, and is preferably conformally deposited.

Figure 8:
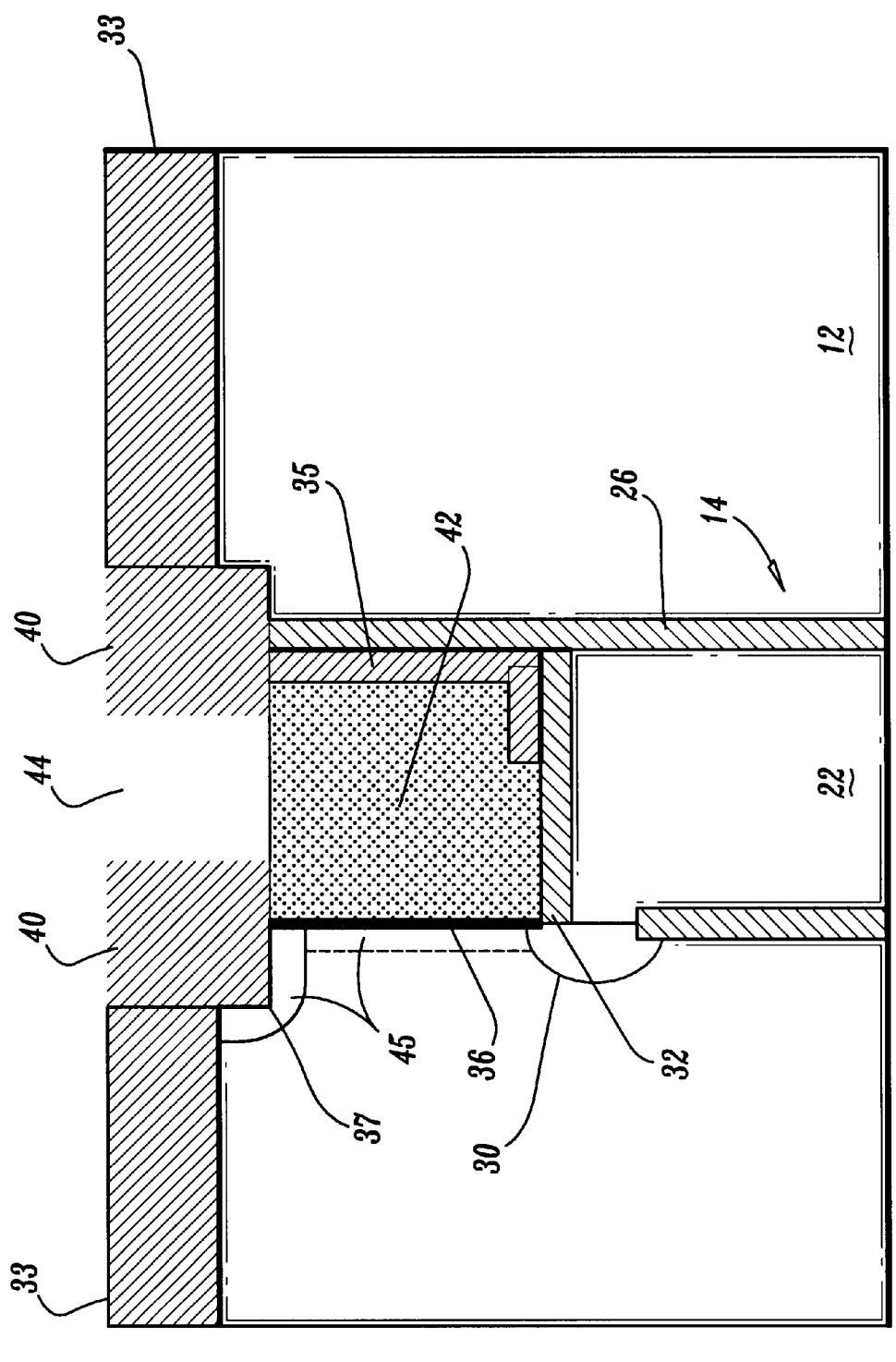
FIG. 8 is a cross-sectional view of the semiconductor device of FIG. 7 showing the conformal dielectric layer uniformly etched in accordance with the present invention.

Referring to FIG. 8, dielectric layer 40 is uniformly etched by employing an anisotropic etching process, such as, for example, a reactive ion etch (RIE) . This leaves layer 40 in the upper part of trench 14 and opens a hole 44 to expose gate conductor 42. A cleaning process may be performed to prepare surfaces for a conductive layer 46 deposition (FIG. 9).

Figure 9:
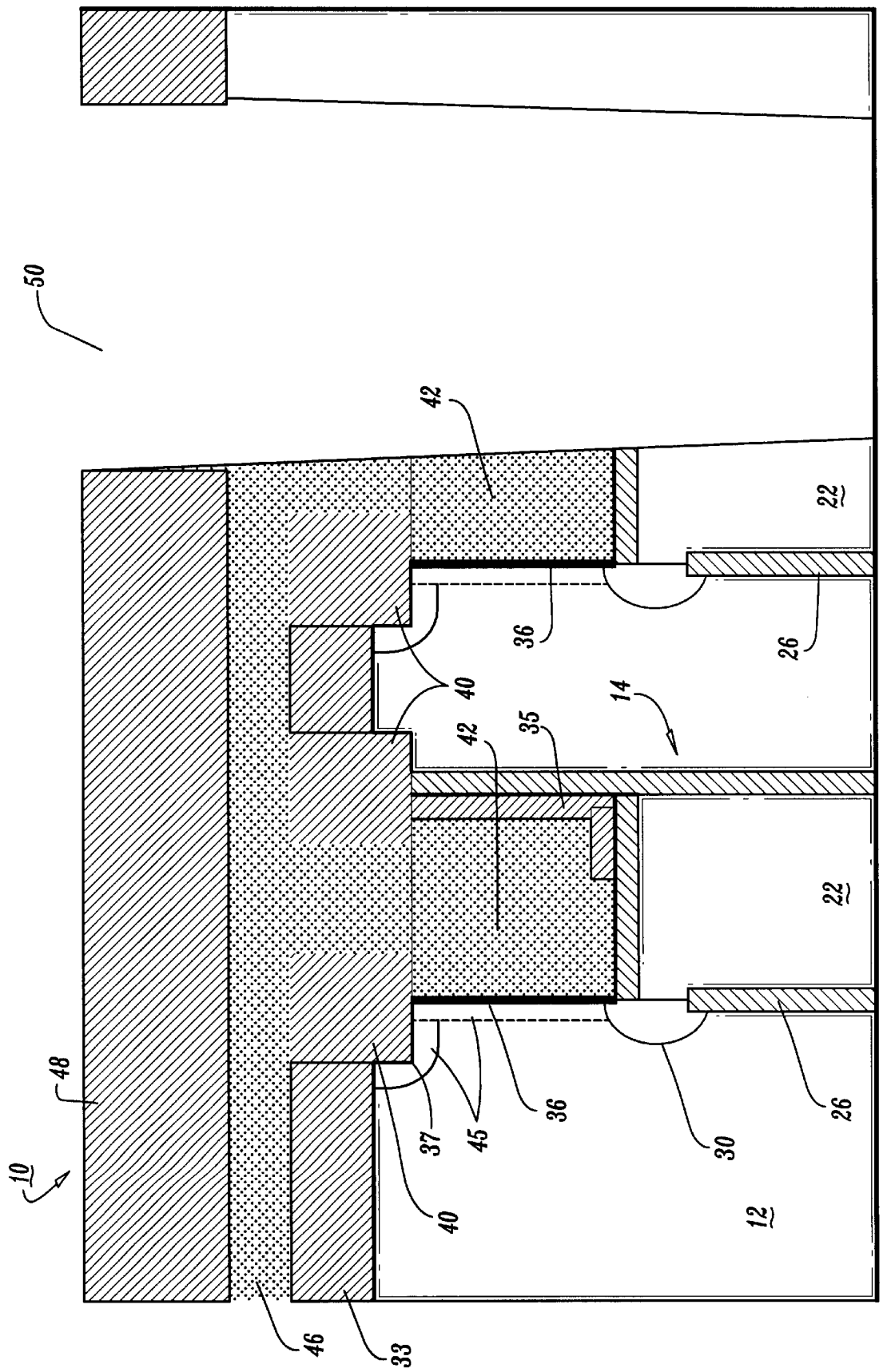
FIG. 9 is a cross-sectional view of the semiconductor device of FIG. 8 showing a second conductive layer deposited to fill a hole through the conformal dielectric layer followed by a mask layer employed to form shallow trench isolation trenches in accordance with the present invention.

Referring to FIG. 9, layer 46, preferably includes undoped polysilicon deposited by an intrinsic deposition process. Layer 46 fills hole 44 (FIG. 8) to provide an electrical connection to gate conductor 42 through dielectric layer 40. Processing continues by depositing a dielectric layer 48, such as TEOS, performing a lithographic patterning process to pattern layer 48 to form an active area mask, and etching the active area to form trench 50 for shallow trench isolation (STI), as is known in the art.

Figure 10:
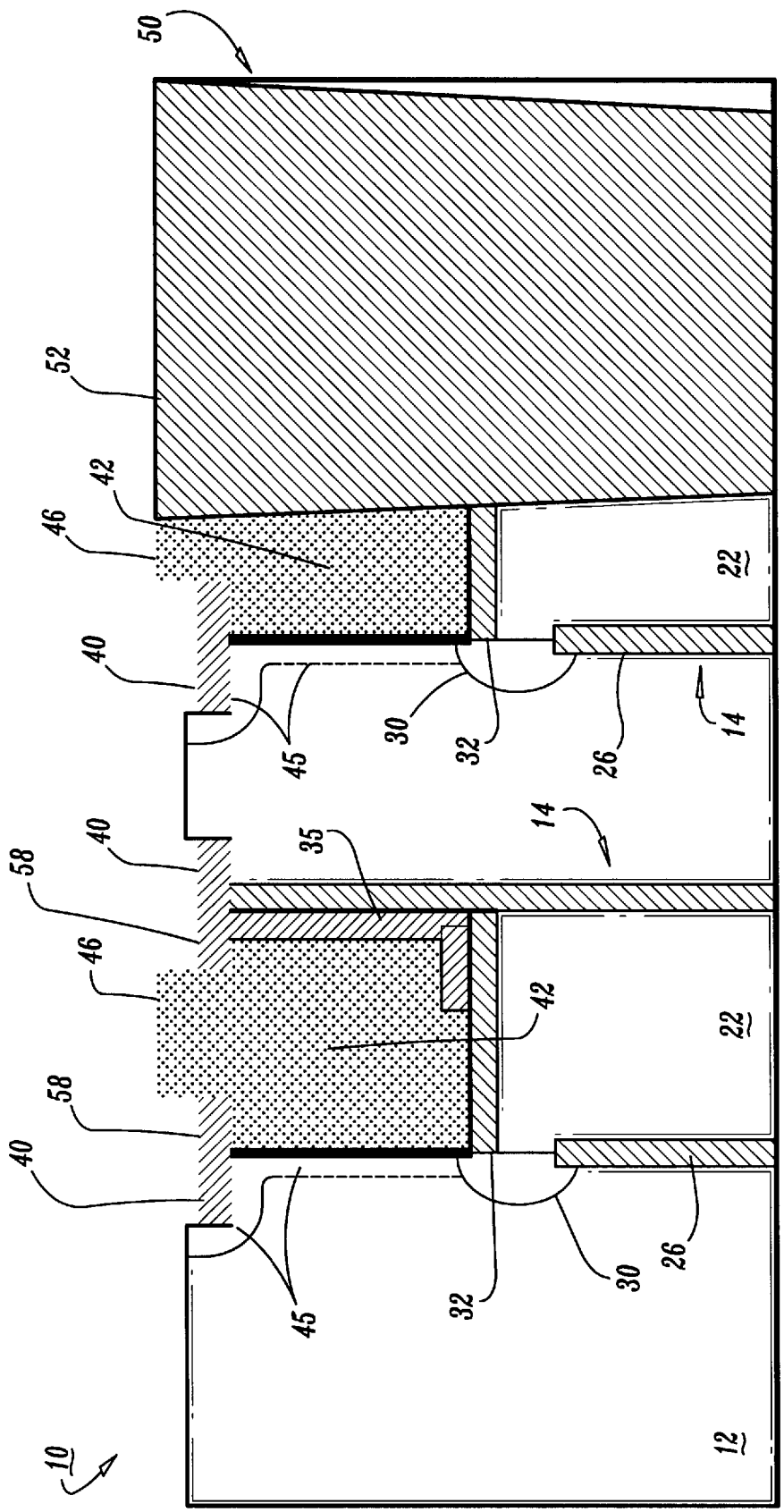
FIG. 10 is a cross-sectional view of the semiconductor device of FIG. 9 showing the conformal dielectric layer etched into the deep trench to form a cap in accordance with the present invention.

Referring to FIG. 10, active area oxidation is performed followed by a dielectric fill 52 of STI trench 50. Fill 52 may include a high-density plasma (HDP) fill to deposit an oxide in trench 50. A planarization process is performed, such as a CMP process, to planarize a top surface of device 10. After the planarization process, layer 46 is removed from pad dielectric layer 33 by an etching process, such as a wet etching process. Pad dielectric layer 33 is then stripped and layer 40 is etched below a surface of substrate 12 (e.g., so that 10 to 20 nanometers or more are left in the deep trench area). Layer 40 now forms a cap 58, which protects gate conductor 42 from damage due to further processing in accordance with the present invention. In one embodiment, the array region (including a memory array as shown in FIG. 10) is processed in conjunction with a support region (not shown), which includes support circuitry, such as, amplifiers, multiplexers, logic circuits, etc. as is known in the art. Further processing of device 10 may include gate sacrificial oxide layer deposition (not shown) and various implantation steps for implanting dopants to form diffusion regions in substrate 12 followed by the removal of the sacrificial oxide. Processing in the support region may continue with gate oxidation followed by polysilicon deposition for gate stacks in the support region. It should be noted that the array region is masked to protect it during at least some of the support area processing. The array mask is now opened to continue processing.

Figure 11:
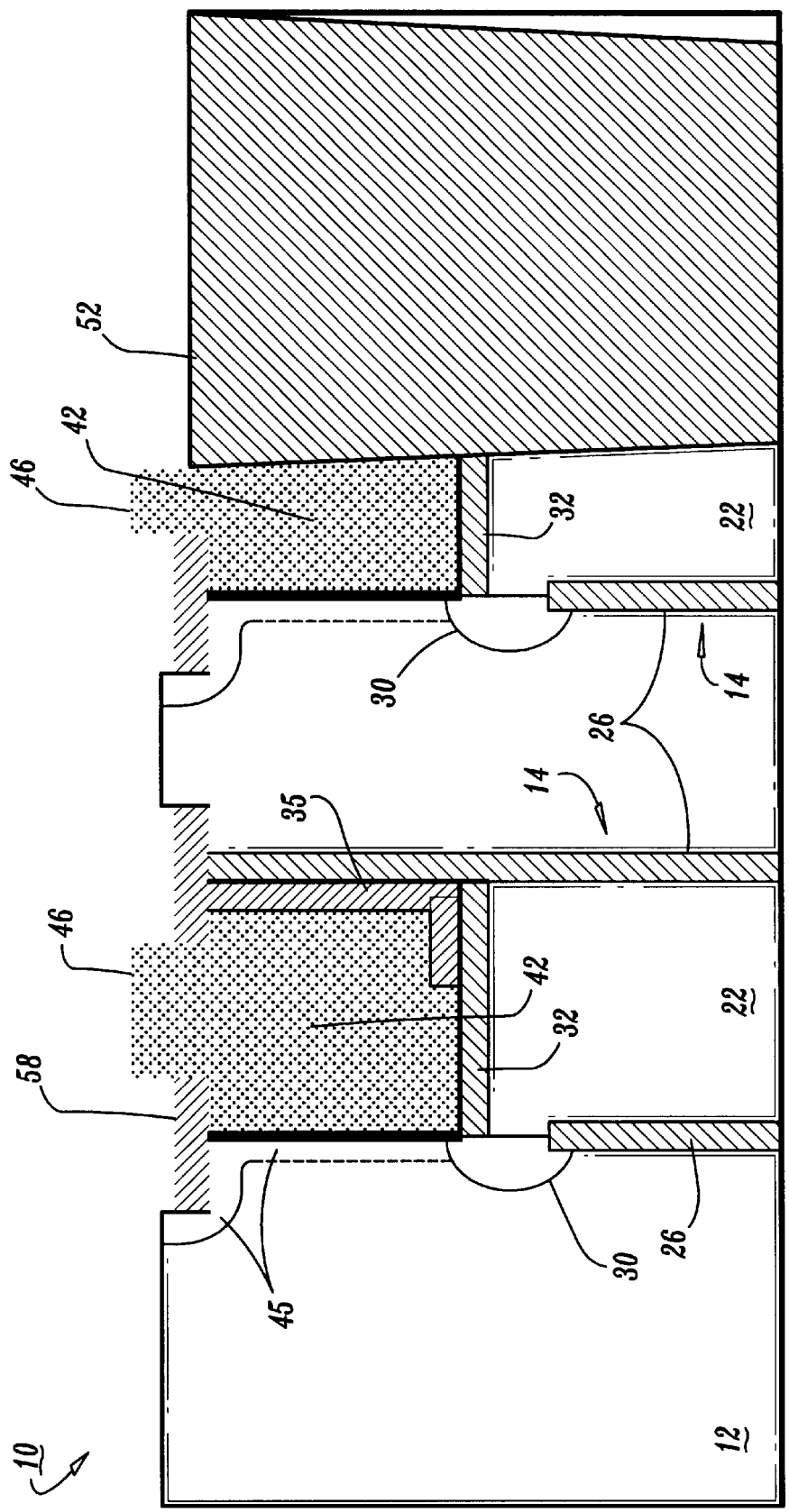
FIG. 11 is a cross-sectional view of the semiconductor device of FIG. 10 after an oxide etch in accordance with the present invention.
Figure 12:
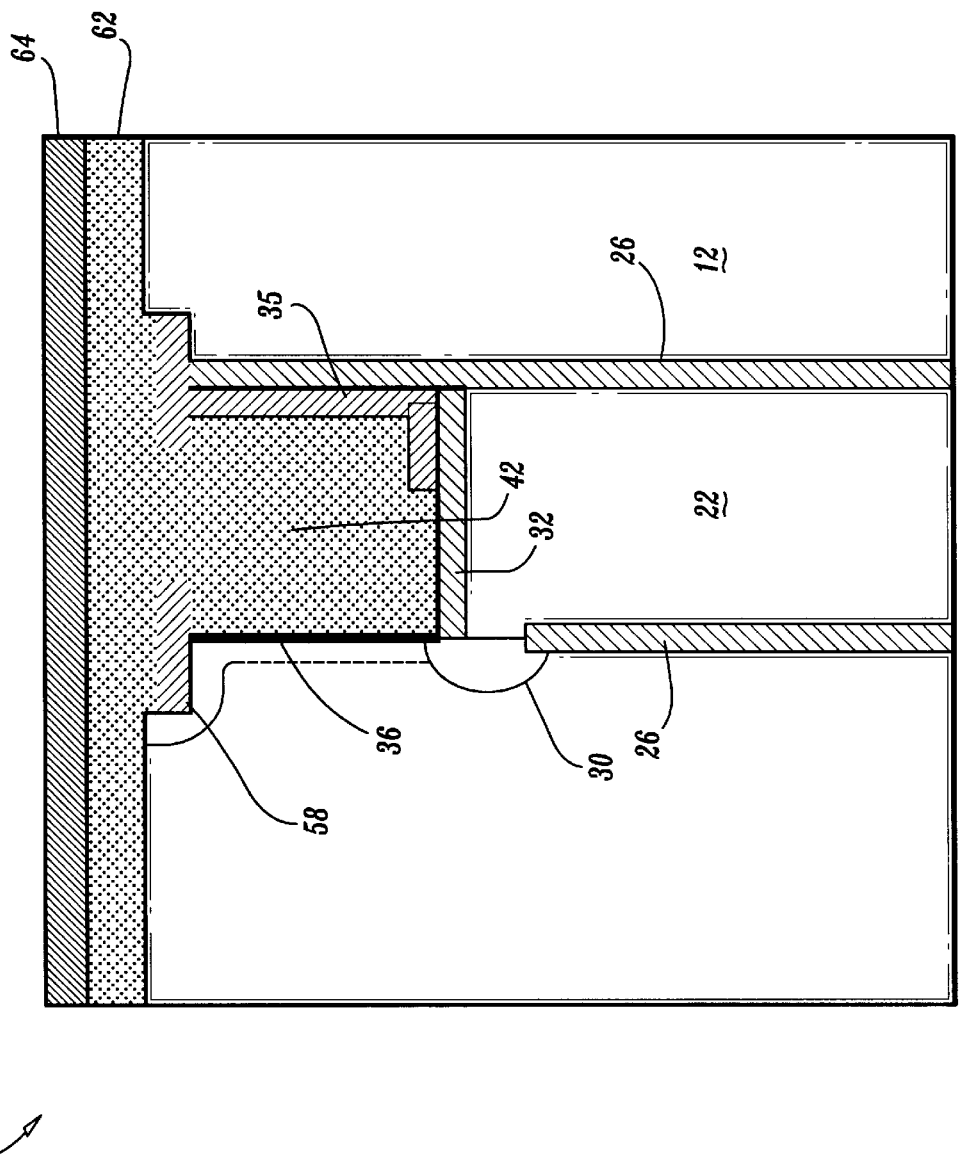
FIG. 12 is a cross-sectional view of the semiconductor device of FIG. 11 showing conductive layers deposited to form a gate stack in accordance with the present invention.

Referring to FIG. 11, a masked etching process is performed to remove oxide (sacrificial oxide and or native oxide) from gate poly studs 46. This etching process also recesses STI 52 below the top surface of substrate 12. As shown in FIG. 12, layers for forming a gate stack are formed over the surface of substrate 12. Other processing steps may also be performed before gate stack formation. For example, a dual work function implant may be performed to provide diffusion regions in substrate 12 for the formation of dual work function devices, which are known in the art.

Figure 13:
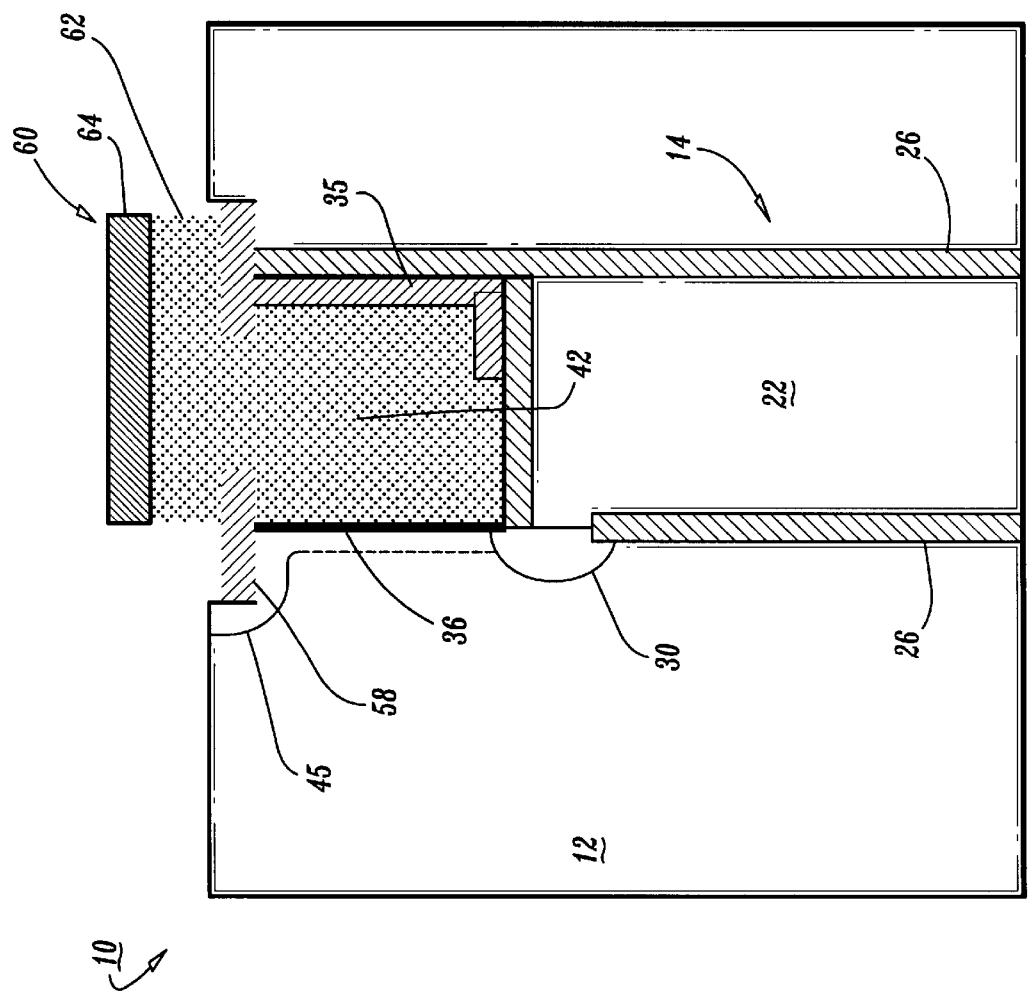
FIG. 13 is a cross-sectional view of the semiconductor device of FIG. 12 showing the conductive layers patterned to form the gate stack in accordance with the present invention.

Referring to FIGS. 12 and 13, a conductive layer or layers are deposited to form a gate stack or word line 60. In a preferred embodiment, gate stack 60 includes a doped polysilicon layer 62 followed by a metal or silicide layer 64. Layer 64 may include, for example, Tungsten and/or Tungsten silicide. Layers 62 and 64 are patterned as shown in FIG. 13.

Alignment between gate stack 60 and gate conductor 42 is significantly less critical in accordance with the present invention than for conventional fabrication methods. Advantageously, cap 58 is provided which protects gate conductor 42 during the etching of gate stack 60. In prior art designs, process windows had to be tightly controlled to reduce the risk of etching gate conductor 42 during gate stack formation. The present invention significantly opens up these process windows.

Alignment of gate stack 60 to trench 14 is no longer as critical, and cap 58 provides etch protection so that etching times can be increased without risk of etching gate conductor 42, by ensuring that all unwanted portions of layers 62 and 64 are removed. By providing cap 58, etching can be performed for a longer time without damage to gate conductor 42. In this way, more process flexibility is gained and higher confidence is achieved that etching is performed to completion. Gate stack 60 may therefore tolerate misalignment relative to trench 14 and an electrical connection is provided between gate stack 60 and gate conductor 42.

Figure 14:
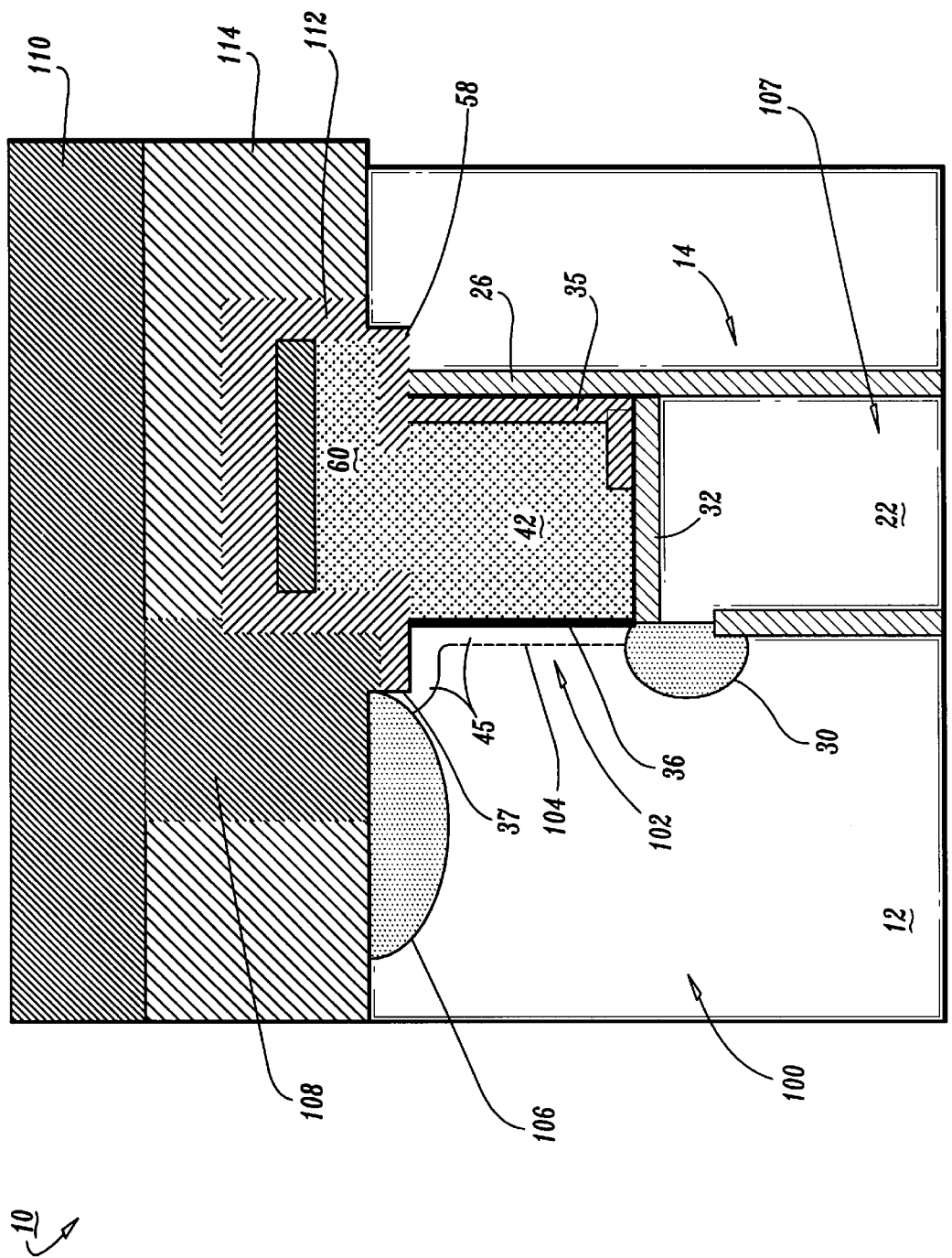
FIG. 14 is a cross-sectional view of a semiconductor device showing a memory cell with a vertical transistor in accordance with the present invention.

Referring to FIG. 14, a cross-sectional view of a vertical transistor memory cell 100 is illustratively shown in accordance with one embodiment of the present invention. A vertical transistor 102 includes a channel 104 which conducts when gate conductor 42 is activated through word line 60 (gate stack). A diffusion region 106 is electrically connected to storage node 22 when channel 104 is conducting to charge or discharge trench capacitor 107. A bitline contact 108 connects diffusion region 106 to a bitline 110. Word line 60 is covered with insulating material 112, such as a nitride. A dielectric layer 114 is also shown as is known in the art. Contact 108 is preferably a borderless contact, which takes advantage of the present invention. Cap layer 58 provides a dielectric barrier between contact 108 and conductor 42. In conventional structures, shorts between a bitline contact and a gate conductor were likely. The present invention prevents or significantly reduces the risk of such shorts.

Having described preferred embodiments for self-aligned nitride pattern for improved process window (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for fabricating a gate structure, comprising the steps of:
   depositing a first conductive material in a trench formed in a substrate;
   recessing the first conductive material to a level below a top surface of the substrate in the trench;
   conformally depositing a dielectric layer in contact with the first conductive material in the trench and in contact with sidewalls of the trench;
   forming a hole in the dielectric layer to expose the first conductive layer;
   filling the hole with a conductive material;
   forming a gate stack over the trench such that an electrical connection is made to the first conductive layer in the trench by the conductive material through the dielectric layer in the trench.

2. The method as recited in claim 1, wherein the step of recessing the first conductive material includes the step of providing an etch mask layer to etch a top surface of the substrate to form an upper portion of the trench which is wider than a lower portion of the trench.

3. The method as recited in claim 1, wherein the step of conformally depositing a dielectric layer includes forming the dielectric layer in the upper portion of the trench.

4. The method as recited in claim 1, wherein the step of forming a gate stack includes:
   depositing a layer polysilicon in contact with the conductive material; and
   depositing an additional conductive material over the polysilicon layer.

5. The method as recited in claim 1, wherein the first conductive layer and the conductive material inside the trench form a gate conductor for a vertical transistor.

6. The method as recited in claim 1, wherein the dielectric layer includes nitride.

7. The method as recited in claim 1, wherein the conductive layer and the conductive material include polysilicon.

8. A method for fabricating a gate structure for vertical transistors, comprising the steps of:
   providing a semiconductor substrate having a trench formed therein having a storage node formed in the trench;
   forming an isolation layer in the trench on top of the storage node;
   depositing a first conductive material in the trench over the isolation layer;
   recessing the first conductive material to a level below a top surface of the substrate in the trench;
   conformally depositing a dielectric layer in contact with the first conductive material in the trench and in contact with sidewalls of the trench;
   etching the dielectric layer to form a dielectric cap in the trench, the cap forming a hole to expose the first conductive layer;
   filling the hole with a conductive material;
   depositing a second conductive layer over the trench; and
   patterning the second conductive layer over the trench to form a gate stack in electrical contact with the first conductive layer.

9. The method as recited in claim 8, wherein the step of recessing the first conductive material includes the step of providing an etch mask layer to etch a top surface of the substrate to form an upper portion of the trench which is wider than a lower portion of the trench.

10. The method as recited in claim 9, wherein the step of conformally depositing a dielectric layer includes forming the dielectric layer in the upper portion of the trench.

11. The method as recited in claim 8, wherein the step of forming a gate stack includes:
   depositing a layer polysilicon in contact with the conductive material; and
   depositing an additional conductive material over the polysilicon layer.

12. The method as recited in claim 8, further comprising the step of forming a gate oxide on a sidewall of the trench.

13. The method as recited in claim 8, further comprising the step of performing an angled implantation of dopants to form a junction along a sidewall of the trench.

14. The method as recited in claim 8, wherein the dielectric layer includes nitride.

15. The method as recited in claim 8, wherein the first and second conductive layers and the conductive material include polysilicon.

16. A semiconductor device, comprising:
   a gate conductor formed recessed to a level below a top surface of a substrate in a trench;
   a gate stack formed over the gate conductor; and
   a dielectric cap layer formed between the gate conductor and the gate stack, for preventing damage of the recessed gate conductor during the formation of the gate stack, the cap layer permitting an electrical connection between the gate conductor and the gate stack, wherein the cap layer includes nitride.

17. The semiconductor device as recited in claim 16, wherein the trench is formed in a substrate, the trench including an upper portion and a lower portion, the upper portion of the trench being wider than the lower portion of the trench.

18. The semiconductor device as recited in claim 17, wherein the cap layer is formed in the upper portion of the trench below a top surface of the substrate.

19. The semiconductor device as recited in claim 16, wherein the gate stack is a word line and the gate conductor is a gate for a vertical transistor.

* * * * *